US010963155B2

United States Patent
Köhler et al.

(10) Patent No.: US 10,963,155 B2
(45) Date of Patent: Mar. 30, 2021

(54) USER INTERFACE FOR A CHARGING COLUMN

(71) Applicant: Dr. Ing. h.c. F. Porsche Aktiengesellschaft, Stuttgart (DE)

(72) Inventors: David Köhler, Bietigheim-Bissingen (DE); Stefan Götz, Forstern (DE); Jakob Brömauer, Pfinztal (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 0 days.

(21) Appl. No.: 16/248,103

(22) Filed: Jan. 15, 2019

(65) Prior Publication Data

US 2019/0227687 A1    Jul. 25, 2019

(30) Foreign Application Priority Data

Jan. 19, 2018 (DE) .......................... 102018101168.7

(51) Int. Cl.
*G06F 3/0488* (2013.01)
*G02B 5/02* (2006.01)
*H01L 31/048* (2014.01)

(52) U.S. Cl.
CPC ......... *G06F 3/0488* (2013.01); *G02B 5/0215* (2013.01); *H01L 31/048* (2013.01); *G06F 2203/04103* (2013.01); *Y02T 90/12* (2013.01)

(58) Field of Classification Search
CPC .......... Y02T 90/14; Y02T 90/12; B60L 53/30; B60L 53/305; B60L 53/31; H02J 7/0027; H02J 7/0042; G07F 15/005; G07F 15/003; G06F 3/0488; G06F 2203/04103; G02B 5/0215; H01L 31/048
See application file for complete search history.

(56) References Cited

U.S. PATENT DOCUMENTS

| | | | | |
|---|---|---|---|---|
| 6,614,204 B2 * | 9/2003 | Pellegrino | ............. | G07F 15/005 320/109 |
| 7,589,798 B2 * | 9/2009 | Takahata | ............. | G02F 1/13338 345/173 |
| 7,663,607 B2 | 2/2010 | Hotelling et al. | | |
| 8,258,914 B2 * | 9/2012 | Kimura | .................... | G06F 3/045 200/600 |
| 8,664,533 B2 * | 3/2014 | Yamazaki | ............... | G06F 3/044 174/253 |
| 8,804,317 B2 * | 8/2014 | Watanabe | ............. | G06F 1/1616 361/679.06 |
| 9,304,566 B2 * | 4/2016 | Theurer | ................ | G06F 3/0481 |
| 9,335,871 B2 * | 5/2016 | Kitano | ............. | B29C 45/14836 |

(Continued)

FOREIGN PATENT DOCUMENTS

| | | |
|---|---|---|
| DE | 102014019006 A1 | 6/2016 |
| EP | 2875989 A1 | 5/2015 |
| WO | 2013063306 A1 | 5/2013 |

OTHER PUBLICATIONS

Glass in Building: Principles, Applications, Examples—Bernhard Weller, Stefan Unnewehr, Silke Tasche—2012—p. 17 (Year: 2012).*

(Continued)

*Primary Examiner* — Michael J Jansen, II

(74) *Attorney, Agent, or Firm* — RatnerPrestia

(57) ABSTRACT

A user interface for a charging column having a display and a touch-sensitive surface. The display and the surface are adhesively bonded to one another by an optically clear adhesive.

11 Claims, 2 Drawing Sheets

(56) References Cited

U.S. PATENT DOCUMENTS

| | | | | |
|---|---|---|---|---|
| 9,588,606 B2* | 3/2017 | Yamazaki | ............... | C23C 14/35 |
| 10,133,108 B2* | 11/2018 | Akkashian | .......... | G02F 1/13338 |
| 10,288,974 B2* | 5/2019 | Hou | .................... | G02F 1/16753 |
| 2003/0120442 A1* | 6/2003 | Pellegrino | ............. | G07F 15/005 |
| | | | | 702/60 |
| 2004/0239641 A1* | 12/2004 | Takahata | ................ | H01H 13/70 |
| | | | | 345/173 |
| 2011/0128114 A1* | 6/2011 | Kimura | ................... | G06F 3/045 |
| | | | | 338/13 |
| 2011/0140656 A1* | 6/2011 | Starr | ....................... | B60L 53/51 |
| | | | | 320/109 |
| 2011/0145141 A1* | 6/2011 | Blain | ................... | B60L 53/665 |
| | | | | 705/39 |
| 2011/0227531 A1* | 9/2011 | Rajakaruna | ........... | B60L 3/0069 |
| | | | | 320/109 |
| 2012/0113614 A1* | 5/2012 | Watanabe | ........... | G02F 1/13336 |
| | | | | 361/810 |
| 2012/0120023 A1* | 5/2012 | Huang | .................... | G06F 3/041 |
| | | | | 345/175 |
| 2012/0249452 A1* | 10/2012 | Kitano | .............. | B29C 45/14836 |
| | | | | 345/173 |
| 2013/0048348 A1* | 2/2013 | Yamazaki | ................ | G06F 3/041 |
| | | | | 174/254 |
| 2013/0110632 A1* | 5/2013 | Theurer | ................ | G06F 3/0481 |
| | | | | 705/14.58 |
| 2013/0168138 A1* | 7/2013 | Yamazaki | ............ | H05K 1/0296 |
| | | | | 174/253 |
| 2014/0248422 A1* | 9/2014 | Jin | ......................... | H05K 3/182 |
| | | | | 427/97.3 |
| 2015/0077239 A1 | 3/2015 | Litjen | | |
| 2015/0103033 A1* | 4/2015 | Lu | ............................ | G06F 3/046 |
| | | | | 345/174 |
| 2015/0234219 A1* | 8/2015 | Petcavich | ............. | G06F 3/0416 |
| | | | | 427/97.3 |
| 2015/0309600 A1* | 10/2015 | Ramakrishnan | ........ | G06F 3/041 |
| | | | | 427/108 |
| 2016/0062509 A1* | 3/2016 | Toyoshima | ............. | B32B 27/06 |
| | | | | 345/174 |
| 2016/0070382 A1* | 3/2016 | Toyoshima | ....... | G02F 1/133528 |
| | | | | 349/12 |
| 2016/0202811 A1* | 7/2016 | Frame | ....................... | G03F 7/00 |
| | | | | 345/173 |
| 2017/0293194 A1* | 10/2017 | Hou | ...................... | G06F 1/1652 |
| 2017/0315396 A1* | 11/2017 | Saiki | ........................ | B32B 3/28 |
| 2017/0329166 A1* | 11/2017 | Akkashian | .......... | G02F 1/13338 |
| 2019/0047900 A1* | 2/2019 | Hu | ......................... | G06F 1/1652 |
| 2019/0227687 A1* | 7/2019 | Kohler | ................. | G06F 1/1626 |
| 2019/0358880 A1* | 11/2019 | Strange | ................... | B65B 63/02 |

OTHER PUBLICATIONS

Fraunhofer—IAO; "Multi-Touch Technologie, Hard-/Software and deren Anwendungsszenarien," Apr. 2010, 88 pages, https://wiki.iao.fraunhoferde/index.php/Studie:_Multi-Touch_-_Technologie,_Hard-/Software_und_deren_Anwendungsszenarien [abgerufen Dec. 17, 2020], with partial English translation.

* cited by examiner

USER INTERFACE FOR A CHARGING COLUMN

CROSS-REFERENCE TO RELATED APPLICATION

This application claims priority to German Patent Application No. DE 10 2018 101 168.7, filed Jan. 19, 2018, which is incorporated by reference herein in its entirety.

FIELD OF THE INVENTION

The present invention relates to a user interface for a charging column.

BACKGROUND OF THE INVENTION

In electrical engineering, the term charging station denotes any stationary apparatus or electrical installation which serves to feed energy to mobile rechargeable battery-operated devices, machines or motor vehicles by simple positioning or plugging-in, without having to remove the energy storage element—for instance the traction battery of an electric automobile. Charging stations for electric automobiles are colloquially also referred to as "electricity charging stations" and can comprise a plurality of charging points, which are characterized as "charging columns" depending on the design.

Known systems here include, in particular, DC rapid charging systems (high performance charging, HPC), such as the so-called combined charging system (CCS) widely used in Europe. In DC charging of the generic type, direct current is fed from the charging column directly into the vehicle and, for this purpose, is provided from the electricity grid by means of a powerful rectifier or at solar charging stations by means of large buffer rechargeable batteries. In the vehicle there is a battery management system, which communicates with the charging column in order to adapt the current intensity or to end the process upon reaching a capacity limit.

In this case, the power electronics are usually situated in the charging column. Since the DC connections of the charging column are directly connected to corresponding connections of the traction battery, high charging currents can thus be transmitted with low dosses, which enables short charging times.

EP2875989, which is incorporated by reference herein, discloses a charging station, the user interface of which comprises a screen unit having a touch-sensitive display surface. For fitting the screen unit in the charging station, a cutout is made in the housing of the charging station on the front side at viewing level. The screen unit is secured behind the cutout in such a way that the touch-sensitive display surface is accessible from the user side.

US2011145141, US2015077239 and WO13063306, all of which are incorporated by reference herein, relate to further relevant charging columns having displays.

SUMMARY OF THE INVENTION

Described herein is a user interface for a charging column wherein the user interface comprises a display and a touch-sensitive surface, and the display and the surface are adhesively bonded to one another by means of an optically clear adhesive.

One advantage of such a user interface resides in its anti-glare operability since the integrated display remains readable even upon incidence of sunlight.

BRIEF DESCRIPTION OF THE DRAWING

One exemplary embodiment of the invention is illustrated in the drawings and is described in greater detail below.

DETAILED DESCRIPTION OF THE INVENTION

Figure 1:
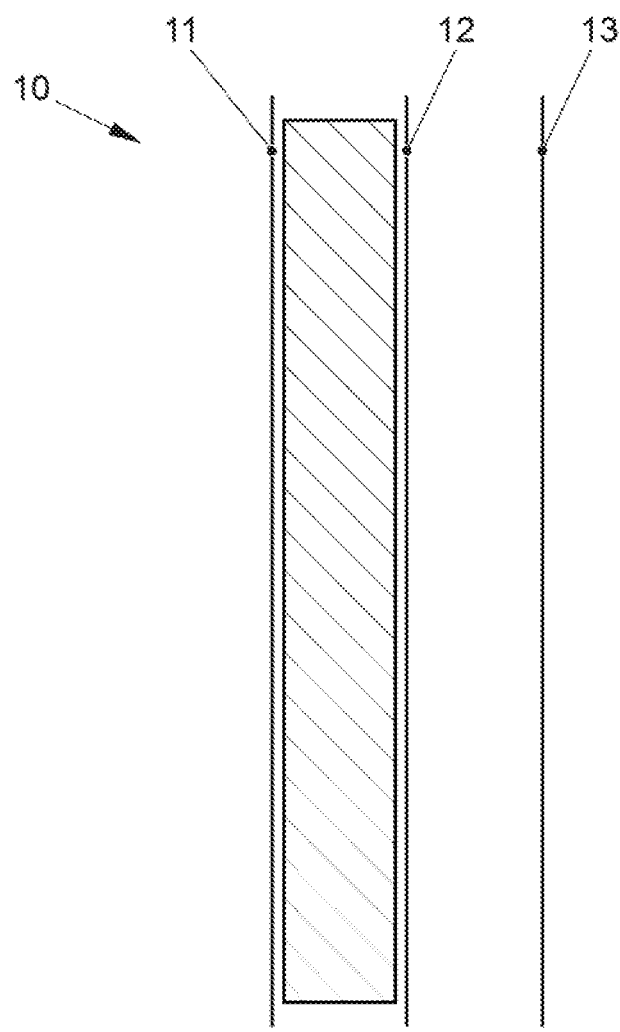
FIG. 1 shows the longitudinal section through a first user interface.

FIG. 1 illustrates, on the basis of a schematic illustration, the structural design of a user interface (10) according to aspects of the invention for a charging column—which is not illustrated in its entirety in the drawings. A core element of the user interface (10), which is embodied in frameless fashion to the greatest possible extent, is the high-resolution TFT display (11) thereof having changing contents, which from the user's viewpoint in the portrait format appears integrated as it were in the side covering of the charging column. In accordance with the operative principle of a so-called touchscreen, the display (11) in this case is provided with a touch-sensitive surface (12).

In order to avoid the air gap remaining between display (11) and surface (12) in conventional user interfaces, according to aspects of the invention the two components are fixedly bonded to one another e.g. by optically clear synthetic resin and are covered by a front glass in the form of a protective sheet (13), such that the touch-sensitive surface (12), as depicted, is arranged substantially plane-parallel between the display (11) and the protective sheet (13). In order to further improve the readability of the display (11), the latter has a particularly intense LED backlighting.

The display (11) preferably comprises at least one backlighting with at least 800 cd/m$^2$, particularly preferably at least 1000 cd/m$^2$. In one embodiment, the display (11) is adhesively bonded to the touch-sensitive surface (12) and the touch-sensitive surface (12) is adhesively bonded to the protective sheet (13) in planar fashion without gaps and apertures. In this case, the adhesive for this adhesive bonding is preferably an optically transparent silicone, acrylate or synthetic resin, for example epoxy. Preferably, at least two side surfaces of the adhesively bonded unit comprising display (1), touch-sensitive surface (12) and protective sheet (13) are covered with a sealant or adhesive such that the adhesive of the adhesive bond between the display (11), touch-sensitive surface (12) and protective sheet (13) is protected and sealed against moisture and air. In one preferred embodiment, the adhesive of the adhesive bond between the display (11), touch-sensitive surface (12) and protective sheet (13) has an optical refractive index similar to that of the protective sheet (13) in the wavelength range of the display (11), e.g. from 440 nm to 650 nm. In this way, the reflection, in particular by total internal reflection, both of the light from the display (11) and of sunlight acting from outside is minimized and the visible contrast is increased. By way of example, the optical refractive index of the adhesive and of the protective sheet (13) is between 1.5 and 1.6. Furthermore, the adhesive preferably has a glass transition temperature of more than 80° C.

In one particular embodiment of the invention, the user interface (10) is furthermore protected against vandalism.

This is achieved according to aspects of the invention by virtue of the fact that the protective sheet (13) consists of toughened glass. As a result, the display can absorb increased compressive forces, mechanical impulses, impacts, scratching and rapid temperature changes without damage and can protect the parts of the user interface that lie behind it. In this case, according to aspects of the invention, the toughening can be carried out both chemically and thermally. The toughening is preferably carried out chemically, however, by a procedure in which, during manufacture, the glass is introduced into heated (preferably above 300° C.) salt solution, in particular salt solutions having cations having higher atomic weights than typical metal atom constituents of the glass such as, silicon and sodium, for example salt solutions of potassium salts, and cations of the salt are caused to diffuse into the surface of the glass with the aim of mechanically stressing the outer layers of the glass relative to the inner layers on account of the higher size and/or bond lengths and/or crystal constants of the cations that have diffused into the glass surface. Alternatively, the glass of the protective sheet (13) can be thermally stressed by slow and homogeneous heating to more than 600° C., preferably more than 700° C., and subsequent rapid cooling e.g. by cool air being blown at the surfaces. For the purposes of the invention this thermal toughening takes place exclusively after cutting to the geometric dimensions of the protective sheet and grinding of edges, in order to dispense with further mechanical processing after the thermal toughening. The surface compressive stress of the glass of the protective sheet is preferably above at least 100 N/mm², particularly preferably at least 170 N/mm². The impact strength of the glass preferably allows at least one impact of a spherical 500 g steel test body falling vertically onto the horizontally presented glass from 1.3 meters, particularly preferably from a height of at least 5 meters.

The protective sheet (13) preferably has a thickness of at least 3 mm, particularly preferably of at least 4 mm.

In one particular embodiment, the protective sheet (13) is furthermore coated with at least two antireflection layers at the surface facing away from the display (11), wherein each layer has an optical refractive index which is in each case higher than that of the adjoining layer facing away from the display (11) and lower than that of the layer facing the display (11) and coincident with the geometric mean of the optical refractive indices of the two adjoining layers. The antireflection layers are preferably designed for sunlight in terms of their thickness.

In a further embodiment, the protective sheet (13) is coated with at least one antireflection layer having a continuously increasing refractive index at the surface facing away from the display (11).

In a further embodiment, the protective sheet (13) coated with an anti-fingerprint layer on the side facing away from the display (11). By way of example, the surface can have a lipophilic layer or be treated such that the surface has lipophilic residual groups chemically bonded to the surface.

In a further embodiment, the glass of the protective sheet (13) is silanized on the side facing away from the display (11).

On account of the inelastic glass, the touch-sensitive surface (12) lying behind the protective sheet (13) from the user's viewpoint does not use resistive touch technology from the prior art. One embodiment of the invention uses surface acoustic waves for detecting a touch of the protective sheet by a user and the location of the touch. For this purpose, this embodiment of the invention furthermore comprises at least two ultrasonic generators and at least two ultrasonic sensors. In this case, the ultrasonic generators are preferably arranged such that they apply ultrasonic waves to the protective sheet (13) in mutually perpendicular directions in the plane of the protective sheet (13). In one embodiment of the invention, the touch-sensitive surface (12) detects a touch of the protective sheet (13) by a user and the position of the touch by means of a change in capacitance. For this purpose, the touch-sensitive surface (12) comprises at least one matrix of approximately parallel electrically conductive lines, electrically conductive lattice or electrically conductive layer of a transparent conductor, preferably indium tin oxide, and at least two AC voltage sources. Preferably, the at least two AC voltage sources are electrically connected to the at least one matrix of approximately parallel electrically conductive lines, electrically conductive lattice or electrically conductive layer of a transparent conductor and generate an AC voltage having a frequency of more than 10 kHz, particularly preferably more than 100 kHz.

Figure 2:
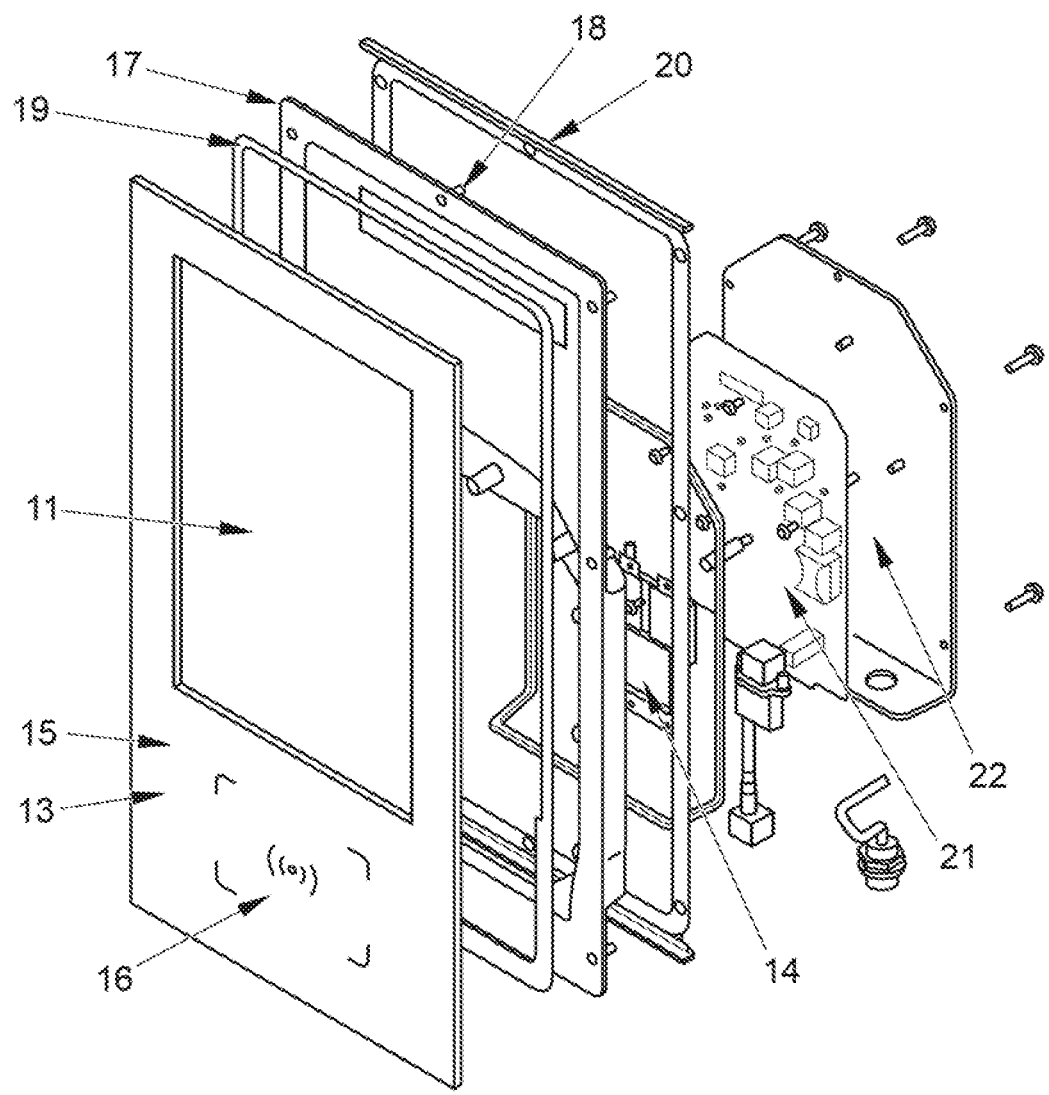
FIG. 2 shows the exploded illustration of a second user interface.

FIG. 2 sheds light on further details of the user interface (10) on the basis of an alternative embodiment. Here a brightness and/or proximity sensor (15) and an RFID/NFC sensor zone (16) are additionally integrated into the front-side protective sheet (13). The rear housing (14) situated therebehind with an integrated mounting frame (17) and press-fitted stud bolts (18) for screwing from inside is separated from the protective sheet (13) just by a thin adhesive seal (19) and is framed by a further, circumferential seal (20) for incorporating the monitor into the charging column housing. The display controller with USB hub (21) arranged behind the rear housing (14) is accessible at the rear side via a service cover (22) for maintenance purposes. In one embodiment of the invention, the area of the protective sheet (13) exceeds the area of the touch-sensitive surface (12) and of the display (11), thereby providing a frame with a minimum width of 10 mm extending circumferentially around the display region. Furthermore, an RFID/NFC sensor (16) is embedded into a portion of the circumferential frame. In this case, according to aspects of the invention, the RFID/NFC sensor can lie directly behind at the surface of the protective sheet (13) facing away from the user and can be mechanically secured thereto by known methods, for example an adhesive bond. In contrast to the prior art, the RFID/NFC sensor is protected by the glass and nevertheless fully functional since, according to aspects of the invention, no electromagnetically shielding metal part is present in the surroundings or on the surface and prevents electromagnetic communication of the RFID/NFC sensor with an external device or transponder.

In a further embodiment, the user interface (10) comprises at least one brightness and/or proximity sensor, wherein the latter can also be in each case an integrated sensor which can detect both brightness and proximity of a person. The at least one brightness and/or proximity sensor is preferably arranged in direct proximity to the protective sheet (13) and oriented in such a way that on the one hand it is protected against vandalism by the protective sheet (13), but on the other hand it can detect the ambient brightness, for example of daylight or street lighting, and an approaching person.

Preferably, the display (10) comprises at least one controller (21) which receives sensor signals of the at least one brightness and/or proximity sensor and, on the basis of the signals, can switch the display (11) on and off and/or vary the brightness of the display (11), for example by means of a dimmable backlighting, continuously variably or in more than five stages. In one particularly preferred embodiment, the at least one controller (21) furthermore receives signals from the touch-sensitive surface (12). Preferably, the at least one controller (21) increases the brightness of the display (11) in the case of increasing ambient brightness and reduces the brightness of the display (11) in the case of decreasing ambient brightness. The relationship between the brightness of the display (11) and the ambient brightness can be approximately linear, for example. If the at least one brightness and/or proximity sensor detects an approaching person preferably the display (11) is activated and/or the brightness of the display (11) is increased. Likewise, in the event of a person moving away being detected or the absence of a person, the display (11) can be deactivated and/or the brightness of the display (11) can be reduced. This can also be carried out with a specific time offset, for example at least 10 seconds. The brightness of the display (11) can be changed abruptly or preferably gradually within a specific time, preferably between 500 ms and 10 seconds. If the at least one controller (21) on the one hand receives from the at least one brightness and/or proximity sensor the information of no person situated in front of the user interface (10) or no information of a person situated in front of the user interface (10), but on the other hand receives signals of the presence of a touch of the touch-sensitive surface (12), the at least one controller (21) preferably does not deactivate the display (11) and preferably also does not reduce the brightness of the display (11).

By reducing the brightness of the display (11) and/or deactivating the display (11), it is possible for the lifetime to be significantly increased and the energy consumption to be reduced.

The closed glass surface formed by the protective sheet (13), which glass surface is formed jointly for protecting all parts of the operator interface (10), thus allows protection according to aspects of the invention of all parts of the operator interface (10) against influences from outside and vandalism, forms a surface without joints and can provide protection against both dust and influence of moisture. Preferably, the protective sheet (13) has at least protection class IP54, which as a result of the design according to aspects of the invention is thus also present for all parts of the operator interface (10) in this particular embodiment.

Furthermore, to prevent the emission of electromagnetic waves from the interior of the housing encompassing the operator interface (10), for example of a charging column, toward the outside, a shield composed of metal, for example an aluminum plate or an aluminum half-shell, composed e.g. of die-cast aluminum, can be fitted on that side of the operator interface (10) which faces away from the user. Said shield composed of metal is preferably electrically connected to a ground potential. According to aspects of the invention, in this case the RFID/NFC sensor remains without a shield, said RFID/NFC sensor being separated from the outside only by the nonmetallic protective sheet (13).

In one embodiment of the invention, the image information of the display (11) is transmitted to the display (11) via an asymmetrical current-controlled bus.

In a further embodiment of the invention, the display signals of the display (11) are transmitted via a differential bus. The differential transmission allows a high susceptibility vis a vis strong electromagnetic interference particularly in the case of switched-mode power supplies and charging systems having currents above 500 A and/or voltages above 700 V. Particularly preferably, the transmitted signals of the differential bus are free of a DC component on average over time. In this case, on the one hand, the signals can be generated and transmitted in a voltage-controlled manner, preferably with a voltage of at least 500 mV, particularly preferably of at least 1.2 V. An alternative to which preference is given, on the other hand, is generation and transmission of differential current-controlled signals having an amplitude of preferably at least +/−1 mA, particularly preferably at least +/−3 mA.

In a further embodiment of the invention, the image information of the display (11) is transmitted to the display (11) via an FDP link interface, preferably of generation III.

The printed circuit boards of the display (11), of the RFID/NFC sensor (16) and of the at least one controller (21) are preferably fashioned in a manner protected against moisture and the environment for example by means of a lacquer coating.

All materials, in particular plastics, adhesives and sealants and resins, are preferably chosen such that they allow operation between −30° C. and 80° C. In particular, the glass transition temperatures are preferably above 80° C.

What is claimed is:

1. A user interface for a charging column, said user interface comprising a display, a touch-sensitive surface, a protective sheet, a brightness sensor configured to sense an ambient brightness, and a controller, wherein the display and the touch-sensitive surface are adhesively bonded to one another by an optically clear adhesive, wherein the controller is configured to control a brightness of the display based on the ambient brightness sensed by the brightness sensor, and wherein the adhesive and the protective sheet both have an optical refractive index between 1.5 and 1.6, wherein the protective sheet is coated with at least two antireflection layers, wherein each of the at least two antireflection layers has an optical refractive index which is higher than an optical refractive index of an immediately adjacent layer facing away from the display and lower than an optical refractive index of an immediately adjacent layer facing toward the display.

2. A user interface for a charging column, said user interface comprising a display, a touch-sensitive surface, and a protective sheet, wherein the display and the touch-sensitive surface are adhesively bonded to one another by an optically clear adhesive, wherein the touch-sensitive surface is arranged between the display and the protective sheet, and wherein the protective sheet is formed from chemically or thermally toughened glass having a surface compressive stress of at least 100 N/mm$^2$ and has a thickness of at least 3 mm, wherein the protective sheet is coated with at least two antireflection layers, wherein each of the at least two antireflection layers has an optical refractive index which is higher than an optical refractive index of an immediately adjacent layer facing away from the display and lower than an optical refractive index of an immediately adjacent layer facing toward the display.

3. The user interface as claimed in claim 1, wherein the user interface has a portrait format.

4. The user interface as claimed in claim 1, wherein the user interface is configured to display different contents on the display.

5. The user interface as claimed in claim 1, further comprising an RFID reader.

6. The user interface as claimed in claim 5, wherein the RFID reader is arranged behind glass.

7. The user interface as claimed in claim 1, wherein the adhesive is a synthetic resin.

8. The user interface as claimed in claim 1, wherein the display is anti-glare.

9. The user interface as claimed in claim 1, wherein the display comprises thin-film transistors and an LED backlighting of the thin-film transistors.

10. The user interface as claimed in claim 1, wherein the adhesive has a glass transition temperature of more than 80° C.

11. A user interface for a charging column, said user interface comprising a display, a touch-sensitive surface, a protective sheet, a brightness sensor configured to sense an ambient brightness, and a controller, wherein the display and the touch-sensitive surface are adhesively bonded to one another by an optically clear adhesive, wherein the controller is configured to control a brightness of the display based on the ambient brightness sensed by the brightness sensor, and wherein the adhesive and the protective sheet both have an optical refractive index between 1.5 and 1.6, wherein the protective sheet is coated with at least one antireflection layer having a continuously increasing refractive index in a direction facing away from the display.

* * * * *